United States Patent [19]

Imam et al.

[11] Patent Number: 5,767,563
[45] Date of Patent: Jun. 16, 1998

[54] INDUCTOR FORMED AT LEAST PARTIALLY IN A SUBSTRATE

[75] Inventors: Mohamed A. Imam, Mesa, Ariz.; Sittampalam Yoganathan, Boise, Id.

[73] Assignee: Micron Technology, Inc., Boise, Id.

[21] Appl. No.: 577,401

[22] Filed: Dec. 22, 1995

[51] Int. Cl.$^6$ ................................................. H01L 29/72
[52] U.S. Cl. ..................... 257/531; 257/281; 257/379; 257/401
[58] Field of Search ............................ 257/531, 281, 257/379, 401

[56] References Cited

U.S. PATENT DOCUMENTS

| | | | |
|---|---|---|---|
| 3,614,554 | 10/1971 | Shield | 257/531 |
| 4,024,565 | 5/1977 | Anthony et al. | 257/531 |
| 5,227,659 | 7/1993 | Hubbard | 257/531 |

*Primary Examiner*—Edward Wojciechowicz
*Attorney, Agent, or Firm*—Schwegman, Lundberg, Woessner & Kluth, P.A.

[57] ABSTRACT

A method of making an inductor and the inductor. The inductor comprises a plurality of serially connected transistors at least partially formed in a substrate, preferably a silicon on insulator substrate, and comprises a gate common to the plurality of transistors. The plurality of transistors, transistor contacts, and electrical interconnects form the coil of the inductor and the gate common to the plurality of transistors forms the core of the inductor. Two inductors of the invention are magnetically coupled to form a transformer of the invention. A control transistor is serially connected to the primary inductor of the transformer. The control transistor is gated by a periodic output signal of a ring oscillator. An actuation and a deactuation of the control transistor allows the current in the primary coil to vary creating a changing magnetic flux in the primary and secondary cores and inducing a fluctuating current in the secondary coil.

15 Claims, 9 Drawing Sheets

INDUCTOR FORMED AT LEAST PARTIALLY IN A SUBSTRATE

RELATED APPLICATIONS

The following applications have been filed and may contain similar material as the present application, U.S. Ser. Nos. 08/363,145 and 08/355,750.

FIELD OF INVENTION

The invention relates to semiconductor devices and more particularly to an inductor formed in at least partially in a substrate of a semiconductor device.

BACKGROUND OF THE INVENTION

Transformers amplify and attenuate fluctuating voltages. A transformer is formed with at least two inductors, a primary and a secondary, lying in close proximity (magnetically coupled) to each other. Each inductor consists of a core and a coil wound around the core. When a fluctuating voltage is applied to the coil of the primary inductor, magnetic lines of flux are created in the core of the primary inductor. The magnetic lines of flux permeate the core of the secondary inductor. The changing values of the magnetic lines of flux in the secondary inductor create a time varying current in the secondary coil and hence an induced emf (electromotive force). The induced emf in the secondary coil is directly proportional to the emf in the primary coil and the ratio of the number of turns of the secondary coil to the number of turns of the primary coil.

Typically, inductors have been large and heavy since they were made using a ferromagnetic core to enhance magnetic flux. Recently, inductors have been manufactured on a semiconductor wafer. One such inductor is described in U.S. Pat. No. 3,614,554.

SUMMARY OF THE INVENTION

The invention includes an inductor partially formed in the silicon in a silicon on insulator (SOI) structure or in another type of substrate of a semiconductor structure. The inductor of the invention is formed using a plurality of serially connected transistors having a common gate. The active area of the substrate used to form each transistor functions as the inductor coil, and the gate functions as the inductor core. Preferably, the gate is connected to the DC supply potential, Vcc.

In one application the invention includes a transformer comprised of two inductors of the invention. The transformer of the invention provides voltage control in order to increase or decrease an external supply potential, Vcc. The number of turns of the primary and secondary coils of the transformer, and thus the turns ratio of the transformer, is controllable by the number of transistors used in fabricating the primary and secondary inductors of the transformer.

In one currently envisioned embodiment a control transistor is serially connected to an external supply node and the primary coil of the transformer. The external supply node is connectable to Vcc. The control transistor is actuated intermittently by an output of a ring oscillator thereby creating a pulsating current in the primary coil. The pulsating current in the primary coil creates a changing magnetic flux in the primary core which permeates the secondary core thereby producing a corresponding pulsating current in the secondary coil. The pulsating current in the secondary coil is converted to obtain a DC potential.

DETAILED DESCRIPTION OF THE PREFERRED EMBODIMENT

Figure 1A:
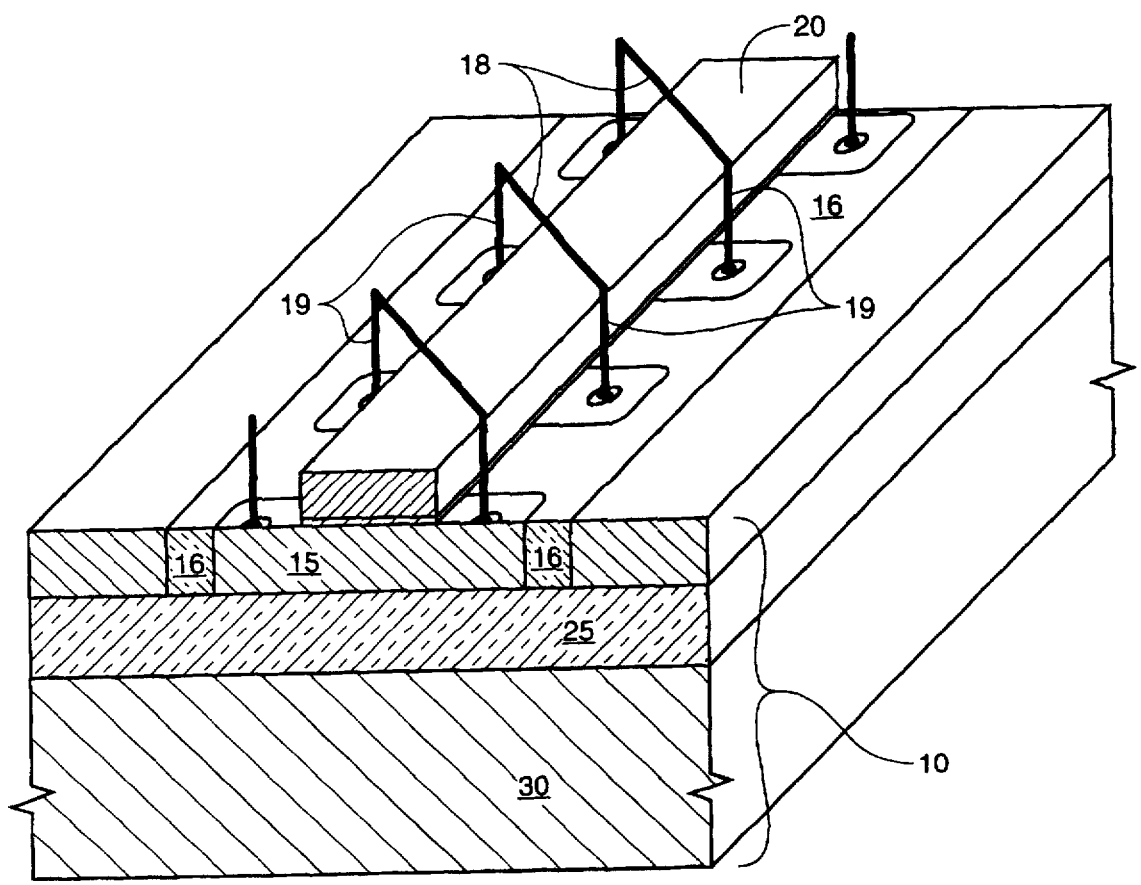
FIG. 1A is a three dimensional view of a preferred embodiment of the invention.
Figure 1B:
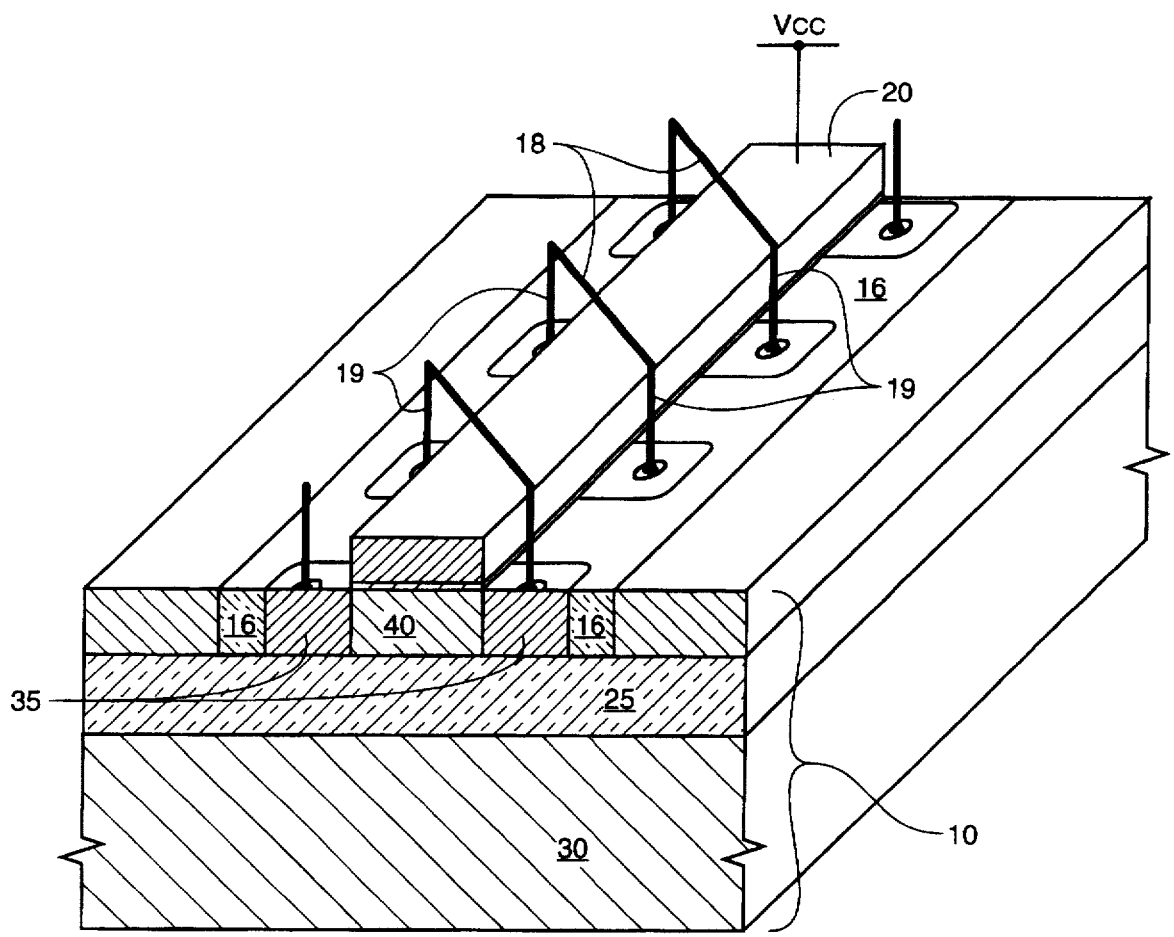
FIG. 1B is a three dimensional view of a further preferred embodiment of the invention.

The invention includes an inductor. FIGS. 1A and 1B show a three dimensional cross section of two embodiments of the invention. A plurality of MOSFET transistors 5 are fabricated using a silicon-on-insulator (SOI) MOSFET process which uses the self isolation property of the SOI 10. Active areas 15 of the substrate are doped to create low resistance regions and/or source/drain regions. A channel is formed in each active area 15 during the actuation of its respective transistor 5. The active area 15 of each transistor 5 is surrounded by an oxide or other electrically insulative material 16 to electrically isolate it from active areas 15 of other transistors 5. The MOSFET transistors 5 are connected in series by meal connections 18 formed during a deposition and etch of at least one metal layer to overlie contacts 19 formed in contact with the source/drain regions of transistors 5. When the transistors 5 are activated, current flows in the active area 15 of the substrate in each transistor 5. The serially connected MOSFET transistors 5 form the coil of the inductor of the invention. Each transistor 5 comprises one turn of the coil. The MOSFET transistors 5 share a gate 20 which forms the core of the inductor. Preferably the gate 20 is connected to Vcc. This ensures that all of the serially connected transistors 5 are activated simultaneously, and that the coil of the inductor is continuous.

In FIG. 1A the active area 15 is an n+region overlying the oxide layer 25, which, in turn, overlies a p substrate 30. In this embodiment the entire film is opened rather than only the source/drain region. Alternately, the active area may be p- with the oxide layer 25 overlying an n type substrate. In addition other combinations used to make silicon on insulator substrates may be used. For example n+over n, p+over p, n+over p, and p+over n are a few of the options available to the designer.

In FIG. 1B the active area 15 is doped to form n+drain and source regions 35. In this embodiment the region underlying the gate 40 is p, and a p type substrate 30 underlies the oxide layer 25. Alternatively, the drain and source regions 35 may be p+ and the regions underlying the gate 40 and underlying the oxide 25 may be n.

Figure 1C:
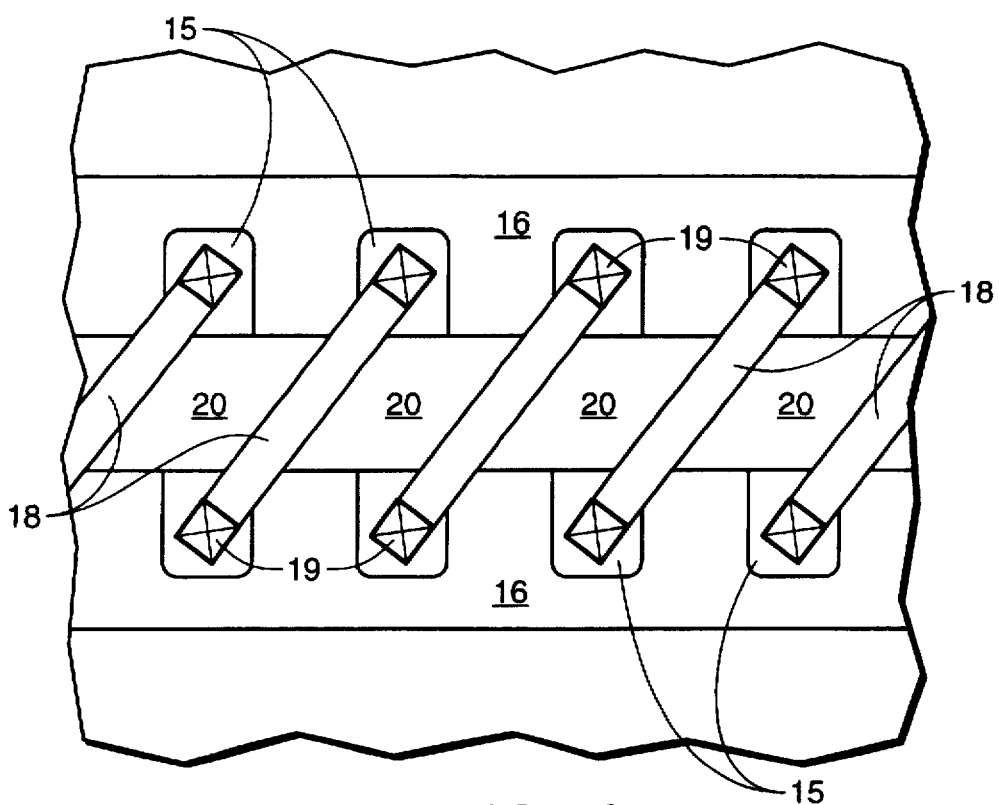
FIG. 1C is a simplified top planar view of the three dimensional views showed in FIGS. 1A and 1B.

FIG. 1C is a top planar view of the three dimensional views shown in FIGS. 1A and 1B, and the components have been numbered the same as in FIGS. 1A and 1B. A BPSG layer typically used to isolate interconnect 18 and contacts 19 from the gate is not shown in this view in order that the components of the inductor can be easily seen. A study of FIG. 1C reveals that the contacts 19, the interconnects 18 and the active regions 15 of the substrate form a conduction path around the gate 20 of the plurality of transistors, thereby allowing the gate 20 to function as a core of an inductor and allowing the conduction path formed in the plurality of active areas 15, contacts 19, and interconnects 18 to function as the coil of the inductor.

Figure 2A:
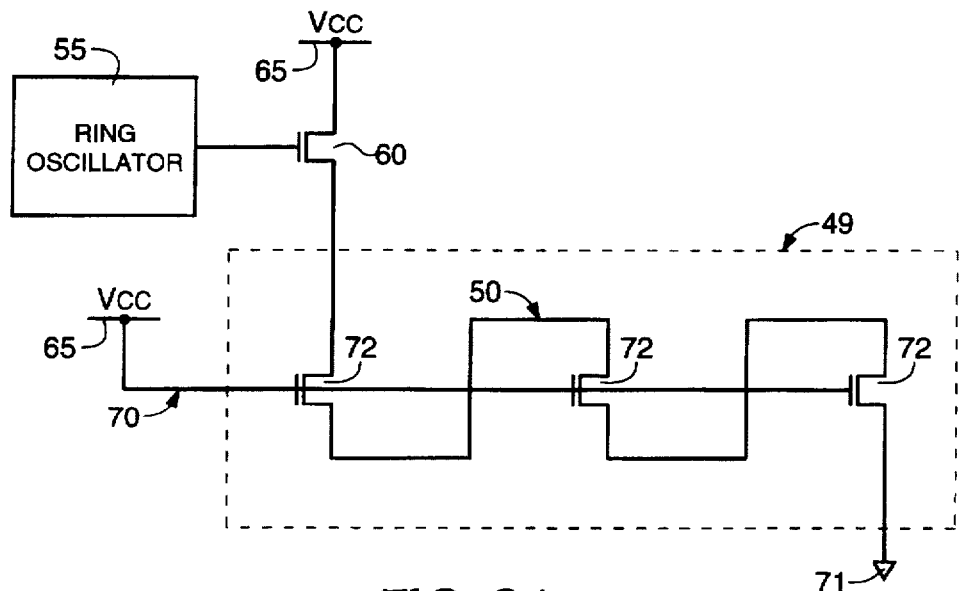
FIG. 2A is a schematic of an embodiment of the invention.

Referring now to FIG. 2A which is a schematic of one embodiment of the inductor 49 of the invention, the output signal of a ring oscillator 55 controls the actuation and deactuation of a control transistor 60 serially connected to the coil 50 and a supply node 65. The supply node 65 is connectable to the external supply potential, such as Vcc, or other DC potential. The core 70 of inductor 49 is connected to supply node 65. The core 70 is the common gate of serially connected transistors 72 which form the coil 50, and in this embodiment the gate, core 70, is continually biased when connected to a constant DC potential. The control transistor 60 actuates and deactuates in response to a periodic oscillator output potential. When the control transistor 60 is actuated serially connected transistors 72 conduct current. As the current changes in response to the actuation and deactuation of the control transistor 60 the magnetic lines of flux which permeate the core change. Thus, the change in magnetic flux is self-timed and dependent on the period and frequency of the periodic oscillator output potential.

Figure 2B:
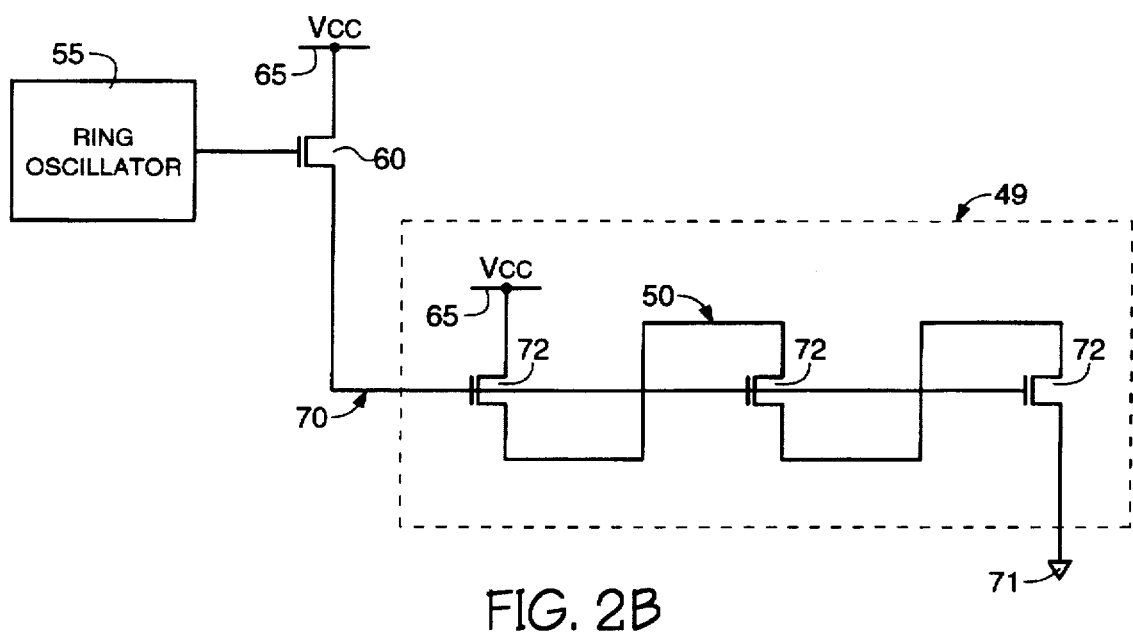
FIG. 2B is a schematic of a further embodiment of the invention.

In yet another embodiment, shown in FIG. 2B, the coil 50 of inductor 49 is connected between the supply node 65 and a reference node 71. A control transistor 60 is serially connected to supply node 65 and to the core 70 of inductor 49. The core 70 is actually the common gate of serially connected transistors 72 which form the coil 50. The periodic oscillator output potential of ring oscillator 55 controls the actuation and deactuation of the control is transistor 60. When control transistor 60 is actuated the supply potential is applied to the core 70 allowing transistors 72 to actuate and allowing current to flow in coil 50. When control transistor 60 is deactuated current flow ceases in the coil. As current varies in the coil 50 the magnetic lines of flux vary in the core 70.

It is also possible to connect a fluctuating potential directly to the coil 50 or the core 70. This can be done by connecting the output node of the ring oscillator 55 directly to the coil 50 or core 70.

In an alternate embodiment the core 70 and coil 50 are both connected to fluctuating potentials and timed to allow the actuation and deactuation of transistors 72.

Figure 3:
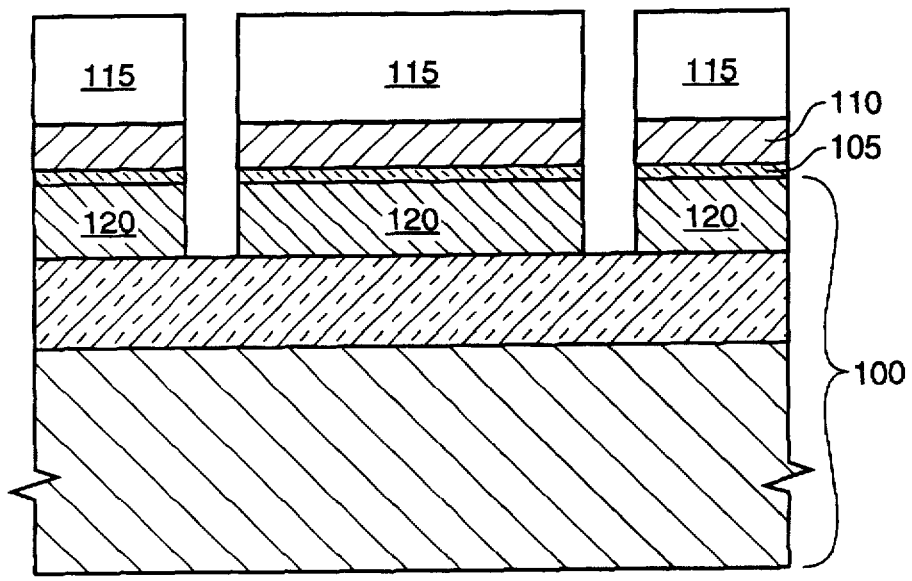
FIGS. 3-8 are cross sectional views of a method for forming the inductor of the invention.
Figure 4:
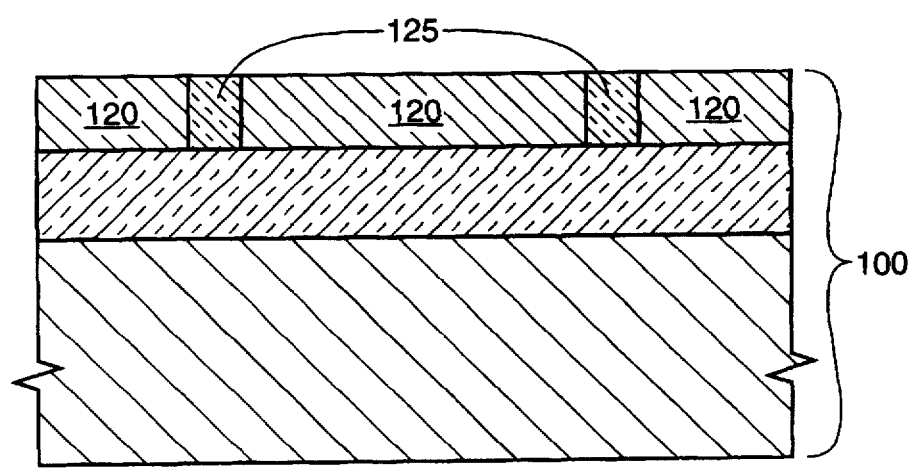

The following is one currently envisioned embodiment for making the inductor of the invention. A blanket well implant is performed on an SOI wafer 100, see FIG. 3. The implant is followed by a well drive. Next pad oxide 105 is deposited, and a nitride layer 110 is deposited overlying the pad oxide 105. Active regions are defined by a mask 115, and the nitride layer 110, the pad oxide 105, and the silicon layer 120 are removed in unmasked regions, and oxide is deposited to create isolation regions 125 in openings formed during the removal of the nitride layer 110, the pad oxide 105, and the silicon layer 120, see FIG. 4.

Alternately, only the nitride layer 110 and the pad oxide 105 are removed. In this case the silicon remaining in the unmasked region is substantially consumed during a field oxide growth to create isolation regions 125. Following the formation of the isolation regions 125 the nitride layer 110 and the pad oxide 105 are removed in the active regions.

Figure 5:
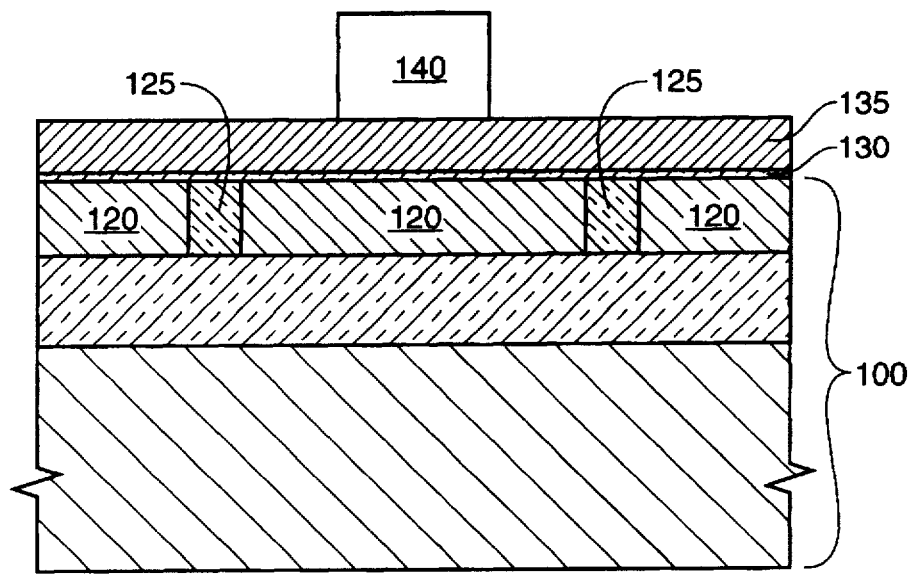

Sacrificial oxide is grown and the substrate is implanted to adjust the threshold voltage of the transistor being formed. This is referred to as a threshold voltage enhancement implant. The sacrificial oxide is then removed and gate oxide 130 is grown, see FIG. 5. Next a layer of polysilicon 135 is deposited and the gate is defined by a masking layer 140.

Figure 6:
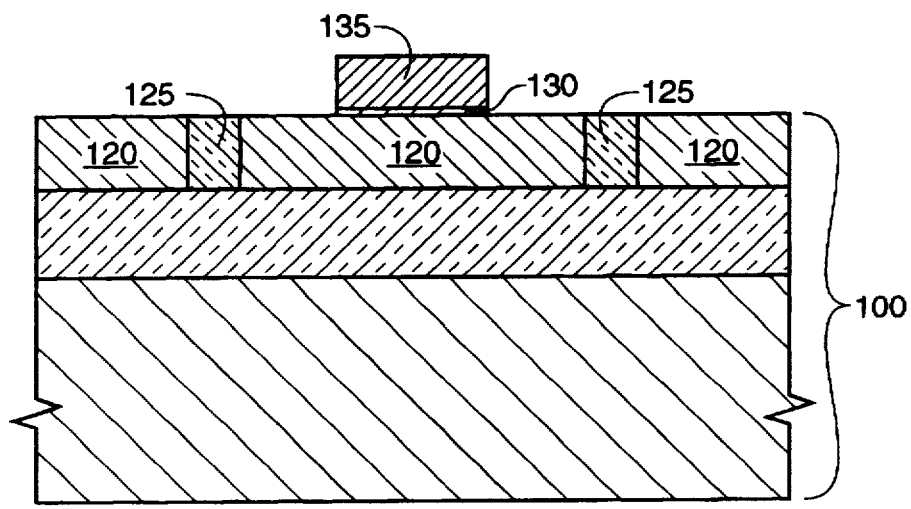

The polysilicon 135 and gate oxide 130 are removed in the unmasked regions, see FIG. 6. The polysilicon 135 remaining forms the core of the inductor of the invention and forms a transistor gate, in conjunction with the gate oxide 130, to the serially connected transistors which form the coil of the invention.

Figure 7:
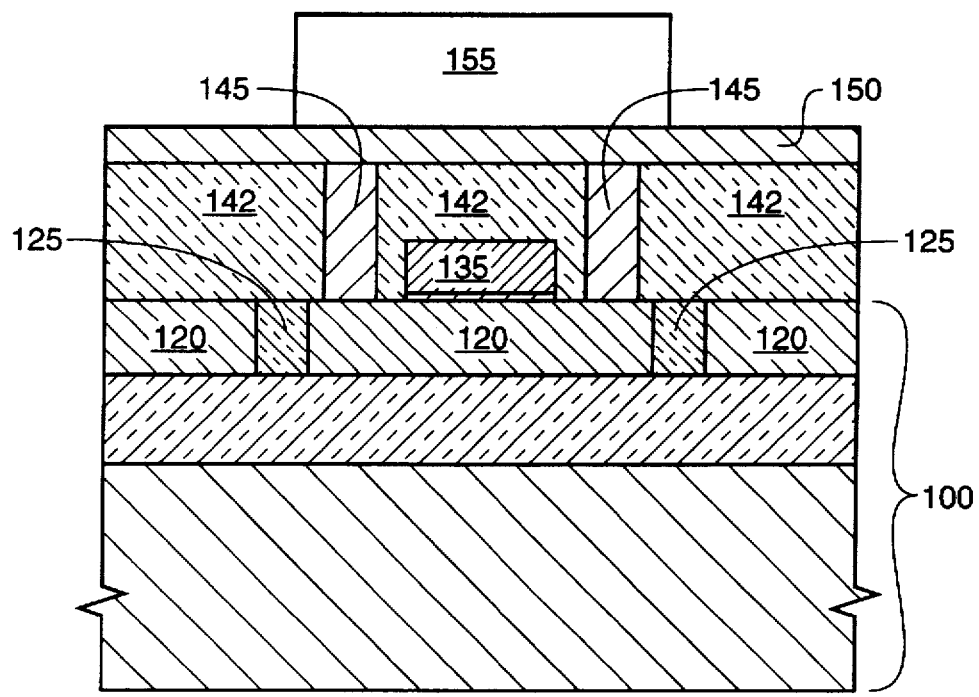

Following the formation of the gate or core a source drain implant is performed. Next BPSG 142 is formed according to conventional methods, and contacts 145 to the source/drain regions are formed in the BPSG using conventional methods, see FIG. 7. Next a metal layer 150 is deposited and masked with mask layer 155 to define interconnections between the drain and source for each two serially connected transistors of the plurality of transistors of the inductor of the invention. Please refer to FIG. 1C to enhance the interpretation of FIG. 7 three dimensionally.

Figure 8:
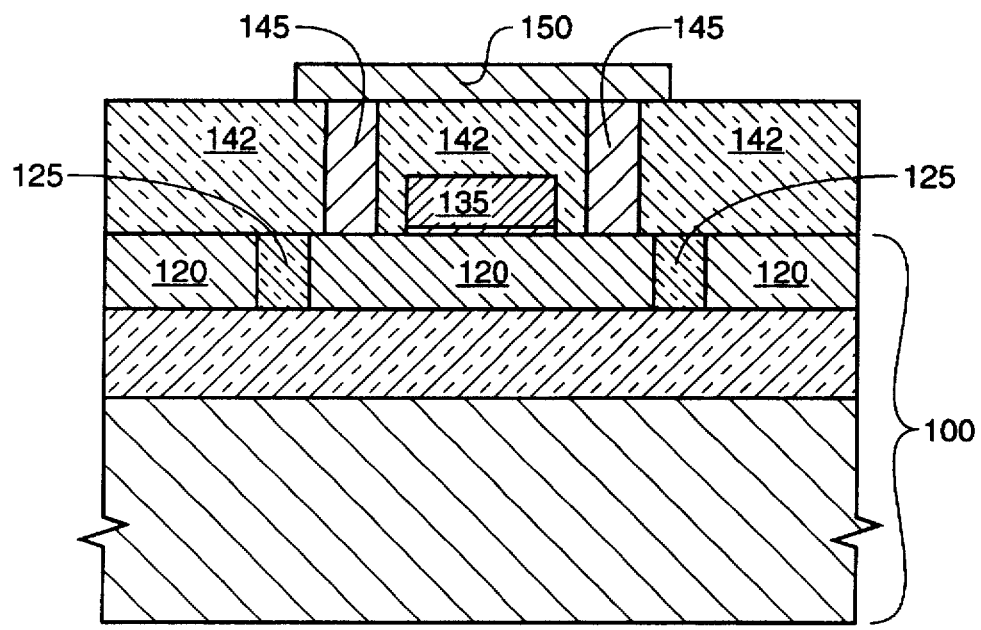

In FIG. 8 the metal layer 150 has been removed in unmasked regions, and mask 155 has been removed. Thus a conduction path is formed with the contacts, interconnects and active areas of the transistors. The conduction path surrounds the core and forms the coil of the inductor of the invention. Please refer to FIG. 1C to enhance the interpretation of FIG. 8 three dimensionally.

Figure 9:
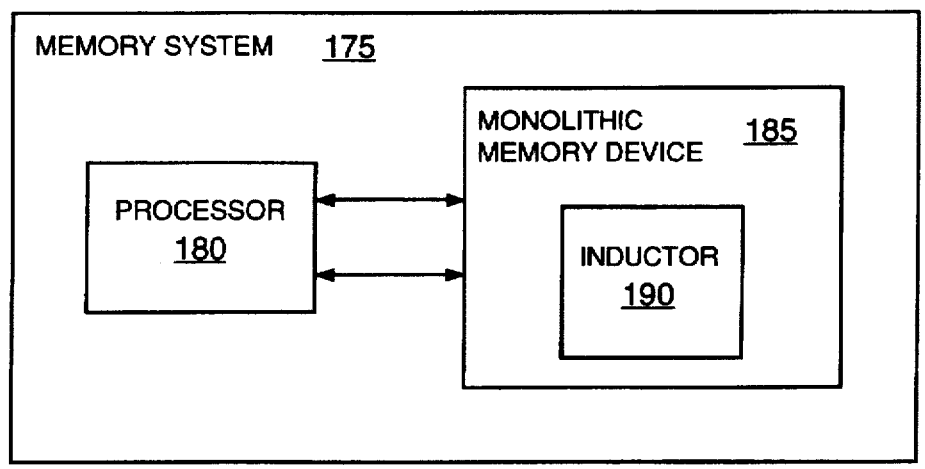
FIG. 9 is a block schematic of a memory system of the invention.

FIG. 9 is a memory system 175 of one envisioned embodiment of the invention. The memory system 175 comprises a processor 180 and a monolithic memory device 185, such as, for example, a dynamic random access memory device. Two inductors 190 of the invention, as described above, are magnetically coupled and used in the monolithic memory device 185 as a transformer to attenuate or amplify the a DC potential. The processor 180 accesses the monolithic memory device 185.

Figure 10:
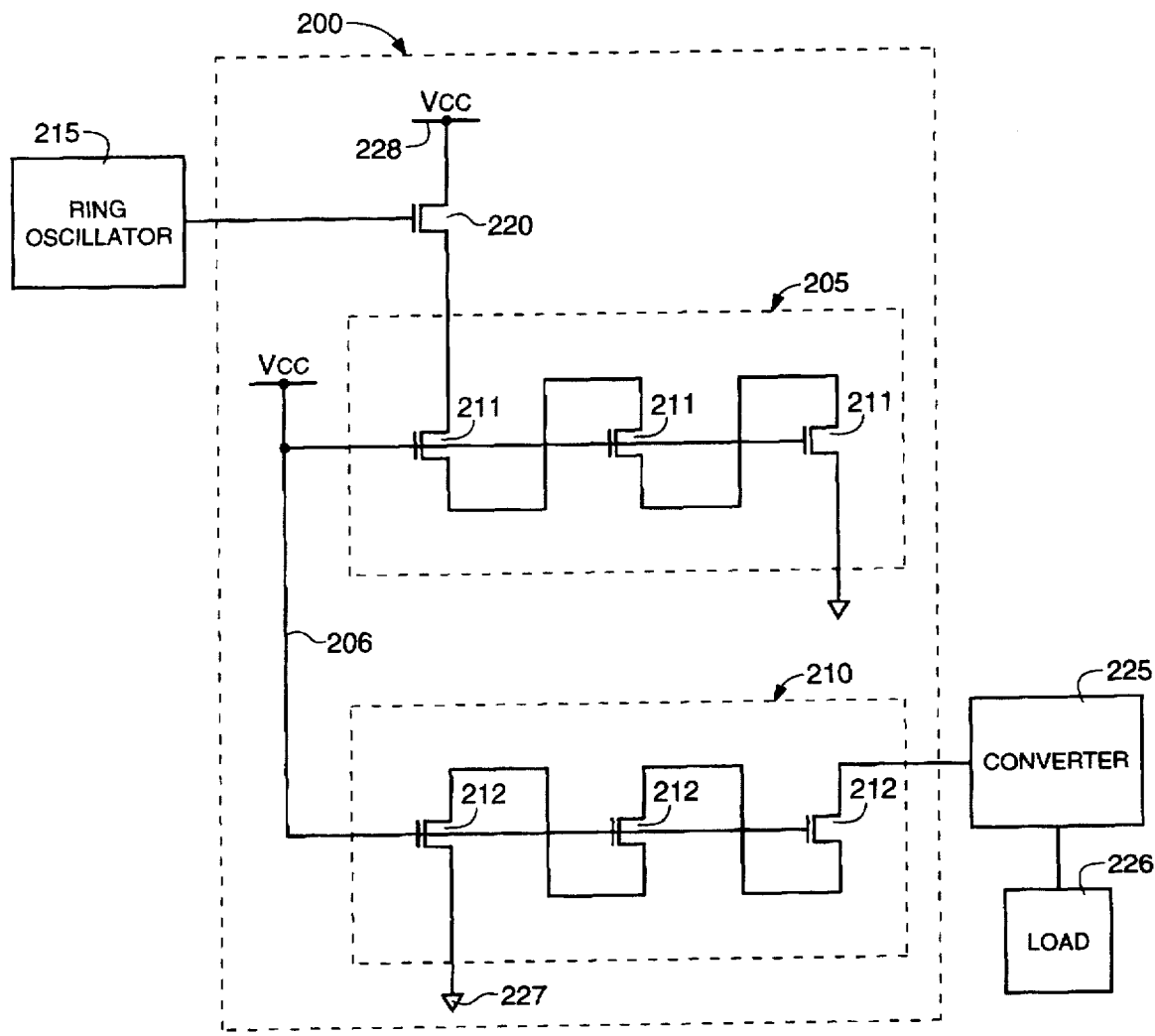
FIG. 10 is a schematic of a transformer of the invention.

FIG. 10 is a transformer 200 of the invention comprising a primary inductor 205 magnetically coupled by way of a common core 206 to a secondary inductor 210 of the invention. It can be seen from the schematic that the common core 206 is a gate common to transistors 211 and 212 which form the primary and secondary coils, respectively. By studying the schematic it can be seen that a mask having the shape of an annular ring can be used to fabricate the common core 206 of the transformer 200. Although one common gate has been shown in FIG. 10, it is also possible to fabricate the transformer wherein the cores of the primary and secondary inductors are physically separated. The periodic output of ring oscillator 215 controls the actuation and deactuation of control transistor 220 to generate a fluctuating current in transistors 211. Varying magnetic lines of flux are created in the primary inductor 205 in response to the fluctuating current generated in the primary inductor 205. The varying magnetic lines of flux permeate the secondary inductor 210 inducing a fluctuating current in the secondary inductor 210. A fluctuating potential is generated in the secondary inductor in response to the fluctuating current. A converter circuit 225 converts the fluctuating potential to a constant DC potential. This DC potential drives load 226, typically internal circuitry of a monolithic memory device. Thus, the transformer 200 attenuates, when the number of transistors 212 is less than the number of transistors 211, or amplifies, when the number of transistors 212 is greater than the number of transistors 211, the DC supply potential to internal circuitry of a monolithic memory device. In FIG. 10 the transistors 212 are electrically interposed between the converter circuit 225 and a reference potential at node 227. Alternately node 227 can be connected to a DC potential, such as Vcc. In either case the fluctuating potential generated in the secondary coil is superimposed on the value of the potential applied to node 227.

In addition, the designer or engineer skilled in the art can orient the coils in such a way to control the polarity of the output signal. Pages 398–423 and 694–700 of *Basic Electronics*, sixth edition, by Bernard Grob, McGraw-Hill Book Company are herein incorporated by reference.

In a further embodiment only one inductor of the invention is be used in combination with another type of inductor to form a transformer of the invention.

Although the invention has been described in preferred embodiments the invention should be limited only as claimed.

What is claimed is:

1. An inductor having a coil and a core, comprising:
   a plurality of serially connected transistors formed on a substrate, each transistor having a source and a drain, said serial connections represented by connectors from the source of one transistor to the drain of the next adjoining transistor, said plurality of serially connected transistors and said connectors forming the coil of the inductor; and
   a gate overlying a channel region of each of said transistors of said plurality of serially connected transistors, said gate at least partially forming the core of the inductor, each of said connectors extending from each source to each drain across an opposite side of said gate from said channel regions.

2. The inductor of claim 1, further comprising a circuit configured to apply a fluctuating potential to said inductor.

3. The inductor as specified in claim 2, wherein said circuit is connected to the core of the inductor.

4. The inductor as specified in claim 2, wherein said circuit is connected to the coil of the inductor.

5. The inductor as specified in claim 2, wherein said circuit comprises:
   a) a supply node connectable to a supply potential;
   b) a control transistor serially interposed between said supply node and said inductor; and
   c) an oscillator in electrical communication with a control node of said control transistor, a periodic output signal of said oscillator controlling an actuation and deactuation of said control transistor.

6. The inductor as specified in claim 1, wherein the number of said serially connected transistors is equal to a number of turns of said coil.

7. An inductor made by a process comprising the steps of:
   forming a plurality of active regions in a substrate;
   electrically isolating said active regions of said plurality of active regions from one another;
   forming an insulative layer overlying a portion of each of said plurality of active regions;
   forming a conductive layer overlying said insulative layer; and
   forming electrical interconnects to serially connect said active regions of said plurality of active regions to each other, said electrical interconnects formed at least partially on an opposite side of said conductive layer from said active regions, wherein said conductive layer forms a core of the inductor, and wherein said electrical interconnects and said plurality of active regions form a coil of the inductor.

8. The inductor made by the process as specified in claim 7, further comprising implanting the substrate in the active regions to create a source, drain and channel region in each of said active regions of said plurality of active regions.

9. A process for making an inductor comprising the following steps:
   forming a plurality of active regions in a substrate, each active region of said plurality having a source, a drain and a channel region;
   electrically isolating said active regions of said plurality of active regions from one another in said substrate;
   forming an insulative layer overlying a portion of each of said plurality of active regions;
   forming a conductive layer overlying said insulative layer; and
   forming electrical interconnects to serially connect said active regions of said plurality of active regions to each other, wherein said conductive layer forms at least a portion of a core of the inductor, and wherein said electrical interconnects and said source, drain and channel regions of said plurality of active regions cooperatively form at least a portion of a coil of the inductor, said coil encircling said core.

10. The process as specified in claim 9 further comprising the step of implanting the substrate in the active regions to create a source, drain and channel region in each of said active regions of said plurality of active regions.

11. An inductor formed on a semiconductor substrate, comprising:
    a first transistor having source, drain, and channel regions formed in said substrate;
    a second transistor having source, drain, and channel regions formed in said substrate;
    a conductor forming a common gate to said first and second transistors; and
    a connector serially connecting the drain of said first transistor to the source of the second transistor, said connector extending across said gate on the opposite side of said gate from the source, drain, and channel regions of said first and second transistors, wherein said connector and said source, drain and channel regions of said first and said second transistors form a coil of said inductor and wherein said common gate forms a core of said inductor.

12. An inductor having a core and a coil, comprising:
    a plurality of serially connected transistors, each of said transistors of said plurality comprised of a source, a drain, and a channel region;
    a plurality of interconnects, each of said interconnects connecting said source and said drain of two serially connected transistors of said plurality of serially connected transistors; and
    a transistor gate, said plurality of serially connected transistors sharing said transistor gate, wherein the core comprises said gate, and wherein the coil comprises a conduction path comprising the channel of each of said transistors of said plurality of serially connected transistors and said interconnects, said interconnects extending on the opposite side of said gate from said channel regions.

13. A memory system comprising:
    a monolithic memory device comprising:
    a plurality of serially connected transistors, each of said transistors of said plurality comprised of a source, a drain, and a channel region;
    a plurality of interconnects, each of said interconnects connecting said source and said drain of two serially connected transistors of said plurality of serially connected transistors;
    a transistor gate, said plurality of serially connected transistors sharing said transistor gate, wherein said transistor gate functions as an inductor core and a conduction path within each of said transistors of said plurality of serially connected transistors and said plurality of interconnects function as an inductor coil, said interconnects extending on the opposite side of said gate from said channel regions; and a processor configured to access said monolithic memory device.

14. A transformer, comprising:

a plurality of serially connected transistors each having a source, a drain and a channel region;

a plurality of interconnects, each of said interconnects connecting adjoining transistors of said plurality from the source of one to the drain of the next, a conduction path comprising the channel region of each of said plurality of serially connected transistors and said interconnects forming a coil of a first inductor of the transformer;

a gate overlying the channel region of each of said transistors of said plurality of serially connected transistors, said gate forming a core of the first inductor, said interconnects extending from each source to each drain on the opposite of said gate from said channel regions; and a second inductor magnetically coupled to the first inductor.

15. A transformer, comprising:

a first plurality of serially connected transistors each having a source, a drain, and a channel region;

a first plurality of interconnects, each of said interconnects connecting adjoining transistors of said first plurality of serially connected transistors from the source of one to the drain of the next, a conduction path comprising the channel region of each transistor of said first plurality of serially connected transistors and said first plurality of interconnects forming a coil of a first inductor of the transformer;

a first gate overlying the channel regions of said transistors of said first plurality of serially connected transistors, said first gate forming a core of the first inductor, said first plurality of interconnects extending between each source and each drain of said first plurality of serially connected transistors on the opposite of said gate from said channel regions;

a second plurality of serially connected transistors each having a source, a drain, and a channel region;

a second plurality of interconnects, each of said interconnects of said second plurality of interconnects connecting adjoining transistors of said second plurality of serially connected transistors from the source of one to the drain of the next, a conduction path comprising the channel region of each transistor of said second plurality of serially connected transistors and said second plurality of interconnects forming a coil of a second inductor of the transformer; and a second gate overlying the channel regions of each transistor of said second plurality of serially connected transistors, said second gate forming a core of the second inductor, said second plurality of interconnects extending between each source and each drain of said second plurality of serially connected transistors on the opposite of said gate from said channel regions, wherein said first and said second inductors are magnetically coupled.

\* \* \* \* \*